United States Patent
Wang et al.

(10) Patent No.: US 10,455,751 B2
(45) Date of Patent: Oct. 22, 2019

(54) MAINTENANCE FIXTURE FOR PRINTED CIRCUIT BOARD ASSEMBLY

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Gang Wang, Beijing (CN); Jianlei Yang, Beijing (CN); Jie Wang, Beijing (CN); Chunming Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 99 days.

(21) Appl. No.: 15/333,549

(22) Filed: Oct. 25, 2016

(65) Prior Publication Data

US 2017/0196130 A1    Jul. 6, 2017

(30) Foreign Application Priority Data

Jan. 4, 2016 (CN) .......................... 2016 1 0006736

(51) Int. Cl.
*H05K 13/04* (2006.01)
*H05K 13/00* (2006.01)

(52) U.S. Cl.
CPC ..... *H05K 13/0486* (2013.01); *H05K 13/0069* (2013.01)

(58) Field of Classification Search
CPC ... C25F 3/12; C25F 7/00; H01L 21/00; H01L 21/306
See application file for complete search history.

(56) References Cited

U.S. PATENT DOCUMENTS

2011/0278717 A1   11/2011   Pagaila et al.
2012/0045910 A1   2/2012    Kim et al.

FOREIGN PATENT DOCUMENTS

| CN | 2711899     | Y |   | 7/2005  |
|----|-------------|---|---|---------|
| CN | 102244012   | A |   | 11/2011 |
| CN | 102421258   | A |   | 4/2012  |
| CN | 202609115   | U |   | 12/2012 |
| JP | 2007523264  | A | * | 8/2007  |

OTHER PUBLICATIONS

The First Chinese Office Action dated Dec. 4, 2017; Appln. No. 201610006736.9.

* cited by examiner

*Primary Examiner* — Carl J Arbes
(74) *Attorney, Agent, or Firm* — Ladas & Parry LLP

(57) ABSTRACT

A maintenance fixture for PCB'A and an operating method thereof are disclosed to mitigate the problems that the PCB'A may be scrapped upon removing a conductive adhesive. The maintenance fixture includes a cover plate and a support baseplate which is configured to support a PCB'A and provided with a stopper unit; the cover plate is movably connected to the support baseplate at a first end to be rotatable towards and away from the support baseplate, and is provided with a barrier layer at a first side which is perpendicular to the rotation direction and close to the support baseplate; the barrier layer is configured to be contacted with the PCB'A upon the cover plate being rotated towards the support baseplate to cover an electronic component zone and expose an electrode zone of the PCB'A.

16 Claims, 9 Drawing Sheets

MAINTENANCE FIXTURE FOR PRINTED CIRCUIT BOARD ASSEMBLY

TECHNICAL FILED

Embodiments of present invention relate to a maintenance fixture for printed circuit board assembly (PCB'A) and a method of operating the maintenance fixture.

BACKGROUND

Liquid crystal displays (LCDs) have been widely used in technique field of display. In order to drive liquid crystals to rotate so as to achieve function of display, the LCD comprises a plurality of drive circuits such as gate drive circuit and source drive circuit. Drive circuits are generally manufactured on a printed circuit board (PCB). PCB refers to a circuit board provided with only wirings but no components, whereas a circuit board on which both wirings and components are disposed is referred to as a printed circuit board assembly (PCB'A).

SUMMARY

Embodiments of the present invention provide a maintenance fixture for printed circuit board assembly (PCB'A) and a method of operating the maintenance fixture, which solve technical problems that wet stripper (cleaning agent) may be infiltrated into an electronic component zone of the PCB'A to cause corrosion and falling off of electronic elements, which may result in the PCB'A scrapped when removing a conductive adhesive in an electrode zone of the PCB'A.

In order to achieve the objective above, the embodiments of the present invention provide technical solutions as below.

On one aspect, a maintenance fixture for printed circuit board assembly (PCB'A) is provided, comprising a support baseplate and a cover plate, the support baseplate being configured to support a PCB'A to be maintained and being provided with a stopper unit, the stopper unit being configured to limit the PCB'A within a PCB'A stopping area defined by a surface of the support baseplate upon the support baseplate supporting the PCB'A; the cover plate being movably connected to the support baseplate at a first end of the cover plate so as to be rotatable towards and away from the support baseplate with regard to the first end; the cover plate being provided with a barrier layer at a first side of the cover plate, the first side being perpendicular to a rotation direction of the cover plate and close to the support baseplate; the barrier layer being configured in such a manner that, upon the cover plate being rotated towards the support baseplate, the barrier layer being contacted with the PCB'A supported on the support baseplate to cover an electronic component zone of the PCB'A and also expose an electrode zone of the PCB'A at the same time.

On the other aspect, a method of operating the maintenance fixture is provided, comprising: placing a PCB'A to be maintained onto the support baseplate and limiting the PCB'A within a PCB'A stopping area defined by a surface of the support baseplate; and rotating the cover plate towards the support baseplate until the barrier layer is contacted with the PCB'A, so as to cover the electronic component zone of the PCB'A and expose the electrode zone of the PCB'A at the same time.

BRIEF DESCRIPTION OF THE DRAWINGS

Hereafter, the embodiments of the present invention will be descried in detail with reference to the accompanying drawings, so as to make those skilled in the art understand the present invention more clearly, wherein.

FIG. 6b is a sectional view taking along a direction of A1B1 in FIG. 6a;

DETAILED DESCRIPTION

Hereafter, the technical solutions of the embodiments of the present disclosure will be described in a clear and complete way in connection with the drawings related to the embodiments of the present disclosure. It is obvious that the described embodiments are just a part but not all of the present disclosure. Based on the described embodiments of the present disclosure, those ordinarily skilled in the art can obtain other embodiment(s), without any inventive work, which come(s) within the scope sought for protection by the present disclosure.

Unless otherwise defined, the technical terminology or scientific terminology used herein should have the same meaning as commonly understood by one of ordinary skill in the art to which this invention belongs. Terms used in the present description and claims such as "first", "second" and so on are only used for distinguishing different components, and cannot be construed as indicating or implying sequence, amount and relative importance. Likewise, a term "a," "an," or "the" does not indicate limitation in number, but specifies the presence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
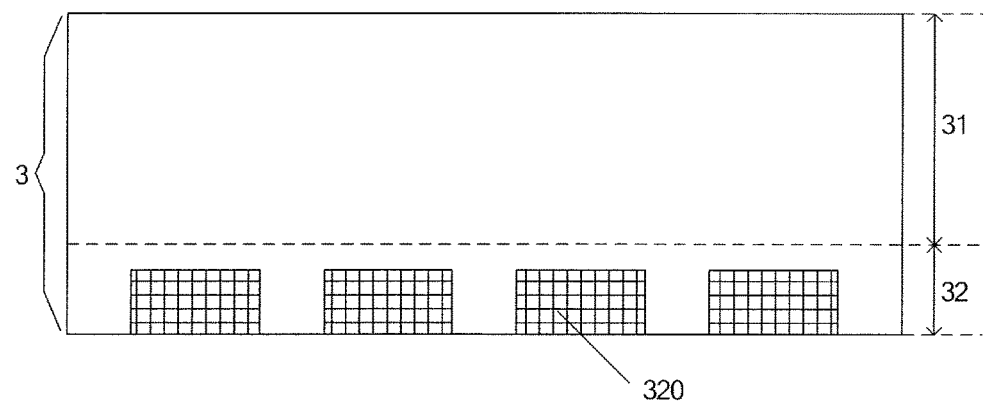
FIG. 1 is a schematically structural view of a printed circuit board assembly (PCB'A)

FIG. 1 illustrates an example of a printed circuit board assembly. As illustrated in FIG. 1, a PCB'A 3 comprises an electronic component zone 31 and an electrode zone 32, wherein the electronic component zone 31 is configured for placing various elements and devices, the electrode zone 32 is provided with several electrode units 320 therein, and each of the electrode units 320 is configured to be bonded with other structures. For example, if the PCB'A 3 with a drive circuit is to be bonded onto a LCD, it is only required to provide a conductive adhesive onto the electrode unit 320 in the electrode zone 32 of the PCB'A 3 and to bond the electrode unit 320 of the PCB'A 3 with corresponding units of the LCD by using the conductive adhesive. Generally, an anisotropic conductive film (ACF) is employed to bond the drive circuit with the LCD.

During manufacturing process and usage, a LCD will be inevitably subjected to various problems, thus it is necessary to return the LCD to factory for maintenance. The inventor of the present application has realized that, when the LCD is subjected to maintenance due to defects occurred in the PCB'A, first of all, the ACF in the electrode zone of the PCB'A needs to be removed so as to facilitate subsequent repairing operations. Usually, a Teflon fixture is used for removing the ACF in the electrode zone of the PCB'A. During the removing process, a wet stripper needs to be coated onto the ACF to facilitate removing. However, the wet stripper is likely to enter the electronic component zone outside the electrode zone, and also has a strong corrosive performance to cause corrosion and falling off of the elements in the electronic component zone, which makes it impossible to continue with the maintenance and hence causes the PCB'A scrapped.

Figure 2:
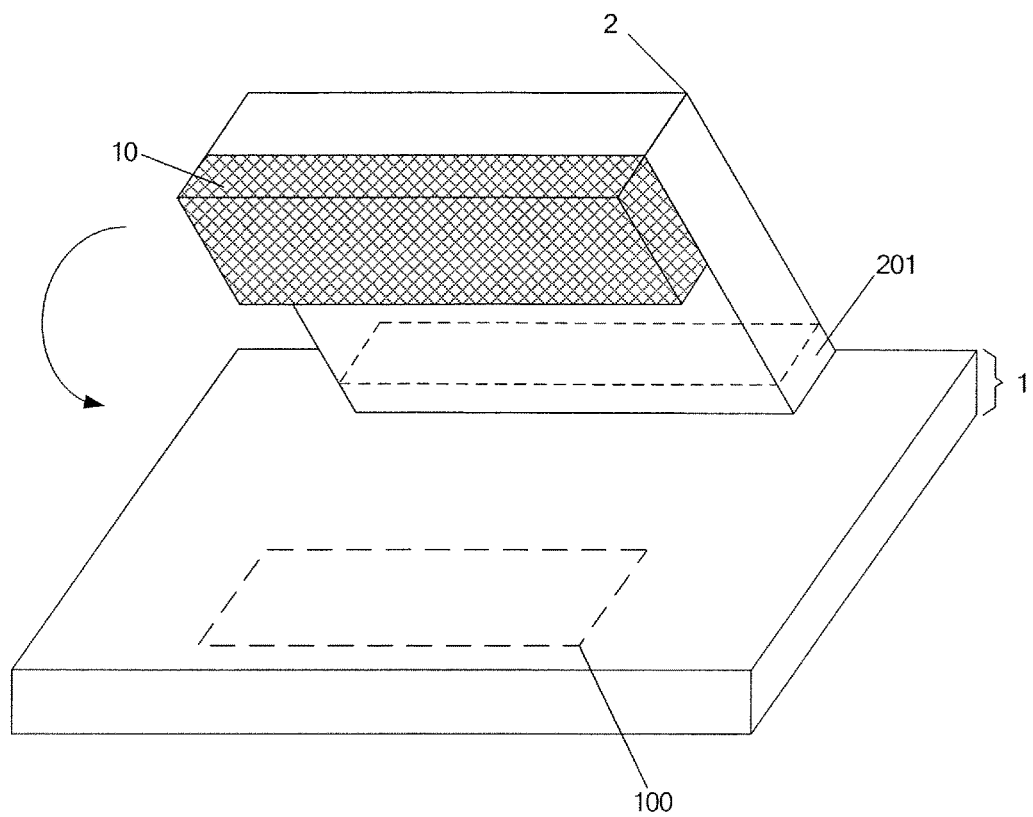
FIG. 2 is a schematically structural view of a maintenance fixture for PCB'A as provided by an embodiment of present invention.
Figure 3:
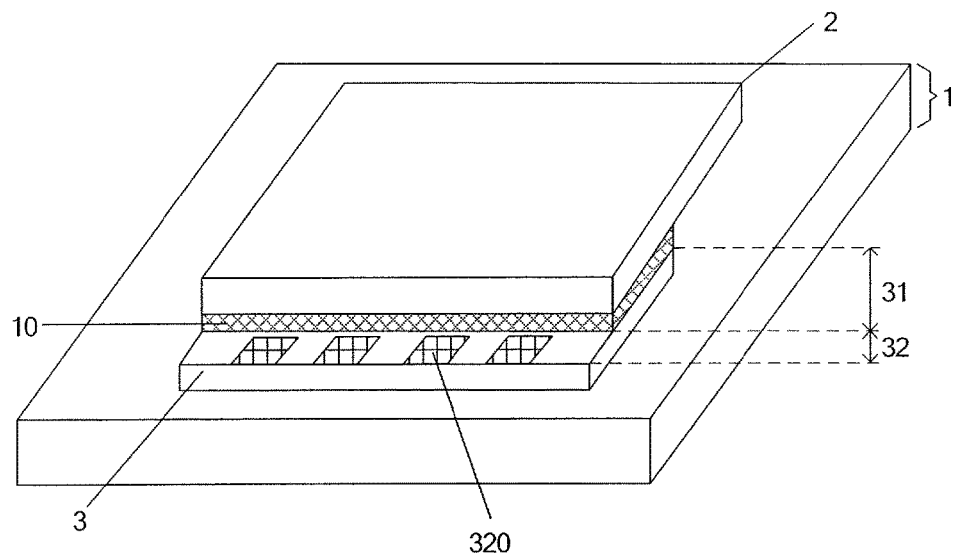
FIG. 3 is a schematically structural view I illustrating the case where a PCB'A to be maintained is placed within an PCB'A stopping area on a support baseplate of the maintenance fixture as illustrated in FIG. 2, with a cover plate of the maintenance fixture being rotated toward the support baseplate.

The embodiments of the present invention provide a maintenance fixture for printed circuit board assembly (PCB'A), as illustrated in FIG. 2, the maintenance fixture comprises a support baseplate 1 configured for bearing a PCB'A to be maintained and a cover plate 2 movably connected with the support baseplate 1, for example, a first end 201 of the cover plate 2 is articulated with the support baseplate 1 so that the cover plate 2 is capable of moving towards the support baseplate 1 or moving away from the support baseplate 1 with regard to the first end 201; wherein the support baseplate 1 is provided with a stopper unit (illustrated in FIG. 4) configured to limit the PCB'A within a PCB'A stopping area 100 on the support baseplate 1; a first side of the cover plate 2 that is perpendicular to a rotation direction of the cover plate 2 and is disposed close to the support baseplate 1 is provided with a barrier layer 10; referring to FIG. 3, after rotating the cover plate 2 towards the support baseplate 1 with regard to the first end 201, the barrier layer 10 is contacted with the PCB'A 3 to cover an electronic component zone 31 of the PCB'A 3 and also exposes an electrode zone 32 of the PCB'A 3 at the same time.

In the above-mentioned maintenance fixture as provided by the embodiment of the present invention, specific ways of achieving the movable connection between the first end of the cover plate and the support baseplate are not particularly defined. By way of example, the first end of the cover plate can be articulated with the support baseplate through a rotation shaft or through a hinge; of course, other ways are also possible, depending on actual conditions.

Figure 4:
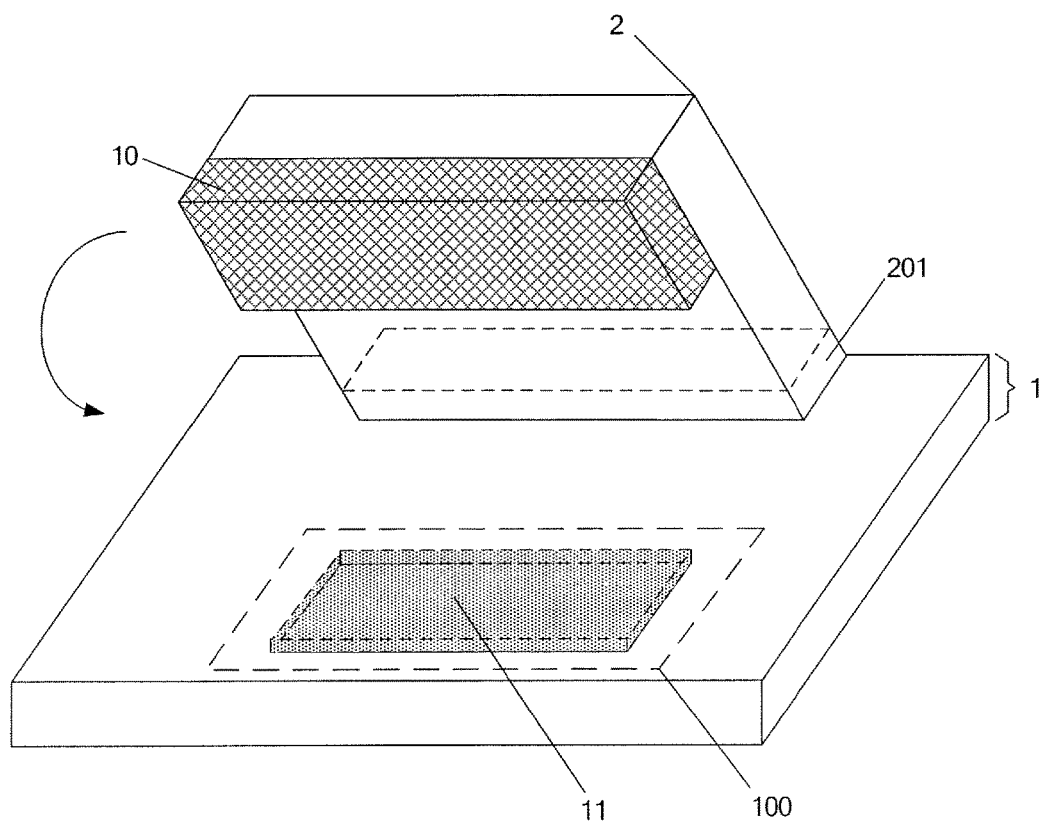
FIG. 4 is a schematically structural view II of the maintenance fixture for PCB'A as provided by the embodiment of present invention.
Figure 5:
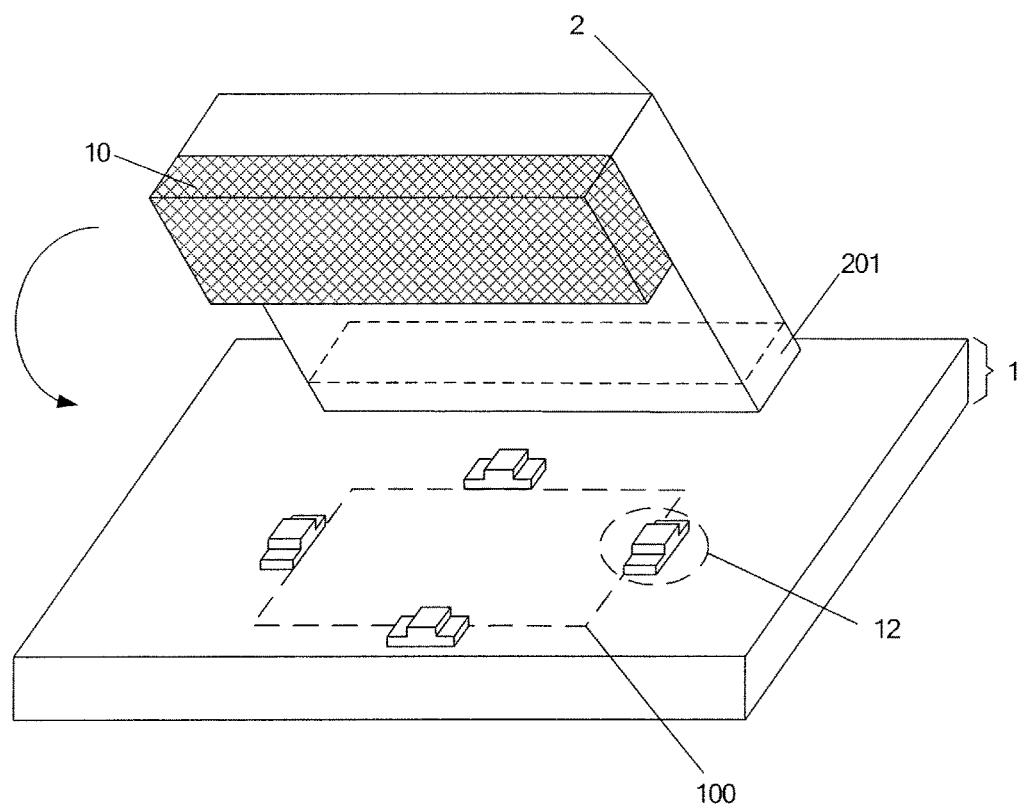
FIG. 5 is a schematically structural view III of the maintenance fixture for PCB'A as provided by the embodiment of present invention.
Figure 7:
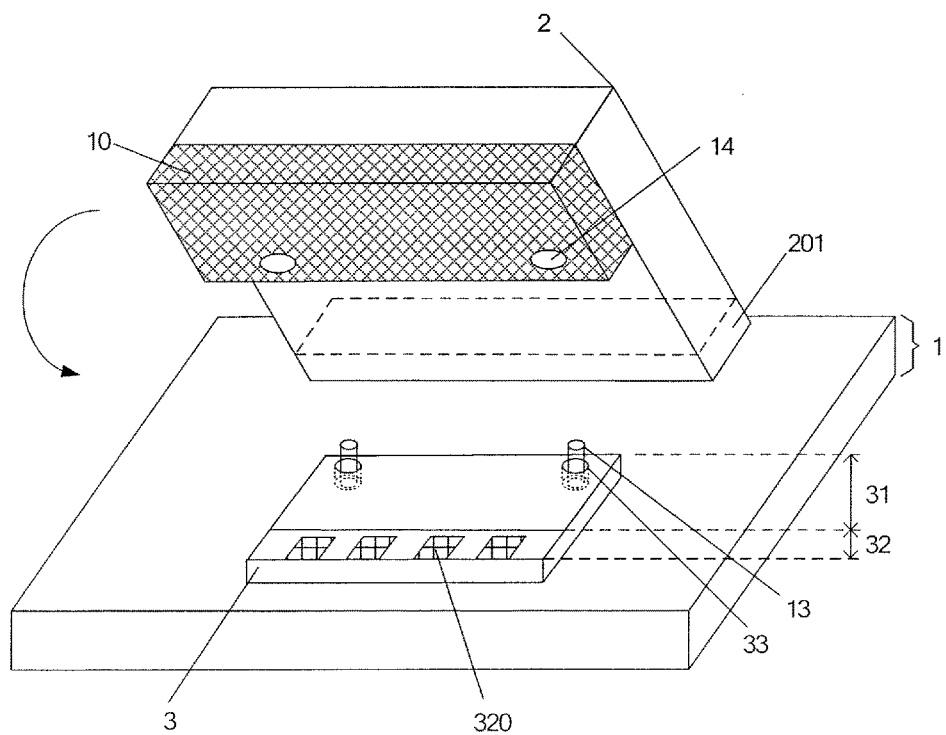
FIG. 7 is a schematically structural view IV of the maintenance fixture for PCB'A as provided by the embodiment of present invention.

In the above-mentioned maintenance fixture as provided by the embodiment of the present invention, specific structures of the stopper unit of the support baseplate are not particularly defined. By way of example, the stopper unit can comprise a stopping groove 11 as illustrated in FIG. 4, or comprises several stopping blocks 12 as illustrated in FIG. 5, or comprises several stopping posts 13 as illustrated in FIG. 7; of course, other structures are also possible, depending on actual conditions.

In the above-mentioned maintenance fixture as provided by the embodiment of the present invention, a specific shape of the PCB'A stopping area on the support baseplate is not particularly defined. By way of example, the PCB'A stopping area can have a shape such as rectangle, circle and trapezoid. In consideration of the fact that the PCB'A usually has a shape of cuboid in practice, the embodiments of the present invention and the drawings will be described with reference to the case where the PCB'A has a shape of cuboid and the PCB'A stopping area has a shape of rectangle by way of example.

In the above-mentioned maintenance fixture as provided by the embodiment of the present invention, a specific material or thickness of the barrier layer of the cover plate is not particularly defined. In consideration of the fact that the barrier layer will cover the electronic component zone of the PCB'A when removing the conductive adhesive in the electrode zone of the PCB'A, the barrier layer can employ elastic materials such as silica gel to functions as a buffer, so as to avoid the elements in the electronic component zone from being damaged by the cover plate due to pressing action. Additionally, the embodiments of the present invention are not intended to define a specific location or shape of the barrier layer. By way of example, the barrier layer can be disposed at the above-mentioned first side of the cover plate and located at a position close to or far away from the first end of the cover plate. For the purpose of convenient operation, as illustrated in FIG. 2, the barrier layer 10 can be located at the position in the first side far away from the first end 201 of the cover plate 2, hereinafter the embodiments and the drawings are all described with reference to the case where the barrier layer is located at a position in the first side far away from the first end 201 of the cover plate 2 by way of example. For example, the barrier layer can have a shape of cuboid, cylinder, trapezoid frustum and so on; considering the fact that the PCB'A usually has a shape of cuboid in practice, the barrier layer can be a cuboid as illustrated in FIG. 2. Hereinafter the embodiments of the present invention and the drawings are all described with reference to the case where the barrier layer is a cuboid by way of example.

As stated above, the maintenance fixture for printed circuit board assembly (PCB'A) as provided by the embodiments of the present invention comprises a support baseplate and a cover plate having its first end movably connected to the support baseplate so as to be rotatable towards or away from the support baseplate with regard to the first end; the support baseplate is provided with a stopper unit configured to limit the PCB'A within the PCB'A stopping area defined by a surface of the support baseplate; the cover plate is provided with a barrier layer at a side which is perpendicular to the rotation direction and close to the support baseplate; when rotating the cover plate towards the support baseplate, the barrier layer is contacted with the PCB'A to cover the electronic component zone of the PCB'A and expose the electrode zone of the PCB'A at the same time. In this way, when removing the conductive adhesive from the electrode zone of the PCB'A, the barrier layer can prevent most of the wet stripper from infiltrating into the electronic component zone, so as to protect the electronic elements within the electronic component zone of the PCB'A, thereby eliminating or at least mitigating the problems that the wet stripper may be infiltrated into the electronic component zone to cause corrosion and falling off of the electronic elements therein which may result in the PCB'A scrapped.

In an example, as illustrated in FIG. 2, the barrier layer 10 is located at an end opposite to the first end 201 of the cover plate 2, which facilitates the manipulation of the above-mentioned maintenance fixture.

In an example, as illustrated in FIG. 4, the above-mentioned stopper unit comprises a stopping groove 11 disposed in the PCB'A stopping area 100. In this way, the PCB'A can be directly placed into the stopping groove. In the embodiments of the present invention, a specific shape, size or depth of the stopping groove is not particularly defined but can be determined according to a shape, size or thickness of the PCB'A. In view of the fact that the existing PCBA is commonly a cuboid, hereinafter the embodiments of the present invention and the drawings are all described with reference to the case where a cross section of the stopping groove is rectangular by way of example.

In an example, as illustrated in FIG. 5, the above stopper unit comprises a plurality of stopping blocks 12 disposed around the PCB'A stopping area 100; for example, the plurality of stopping blocks 12 are disposed along edges of the PCB'A stopping area 100. In this way, upon placing the PCB'A at the PCB'A stopping area, a location of the PCB'A can be limited by means of the plurality of stopping blocks. The specific structure or number of the stopping block is not particularly defined in the embodiments of the present invention. In an example, considering that the existing PCB'A is normally cuboid, as illustrated in FIG. 5, by arranging an stopping block at each of the four sides of the cuboid PCB'A, it is sufficient to achieve better stopping effect. To be specified, the stopping blocks illustrated in FIG. 5 can be secured by using screws or adhesives; of course, other ways are also possible without limiting.

To be specified further, the location of the above-mentioned stopping block on the support baseplate can be immobile or adjustable, the latter is preferable to limit PCB'As with different sizes thereby expanding an application field of the maintenance fixture.

Figure 6A:
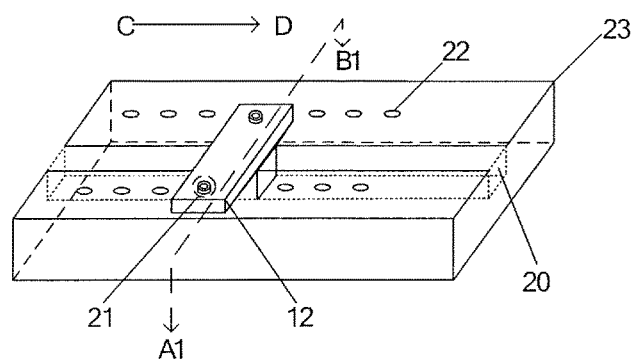
FIG. 6a is a schematically structural view of a stopper unit comprising a slidable stopping block in the maintenance fixture for PCB'A as provided by the embodiment of present invention.
Figure 6B:
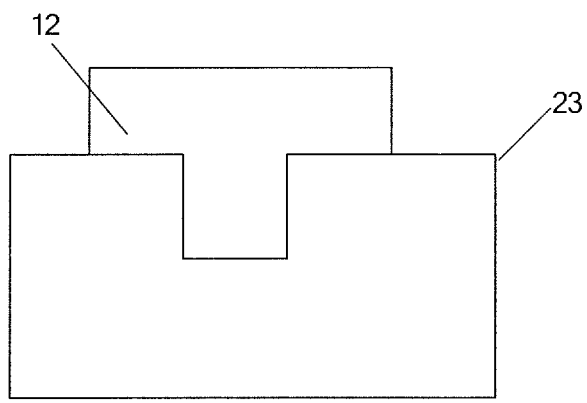
Figure 6C:
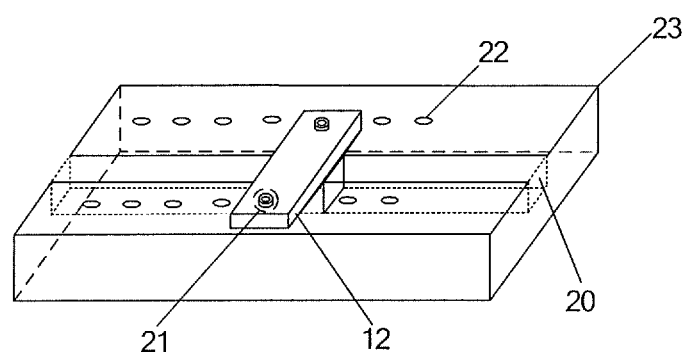
FIG. 6c is a schematically structural view of the stopping block in FIG. 6a after the stopping block is sliding.
Figure 6D:
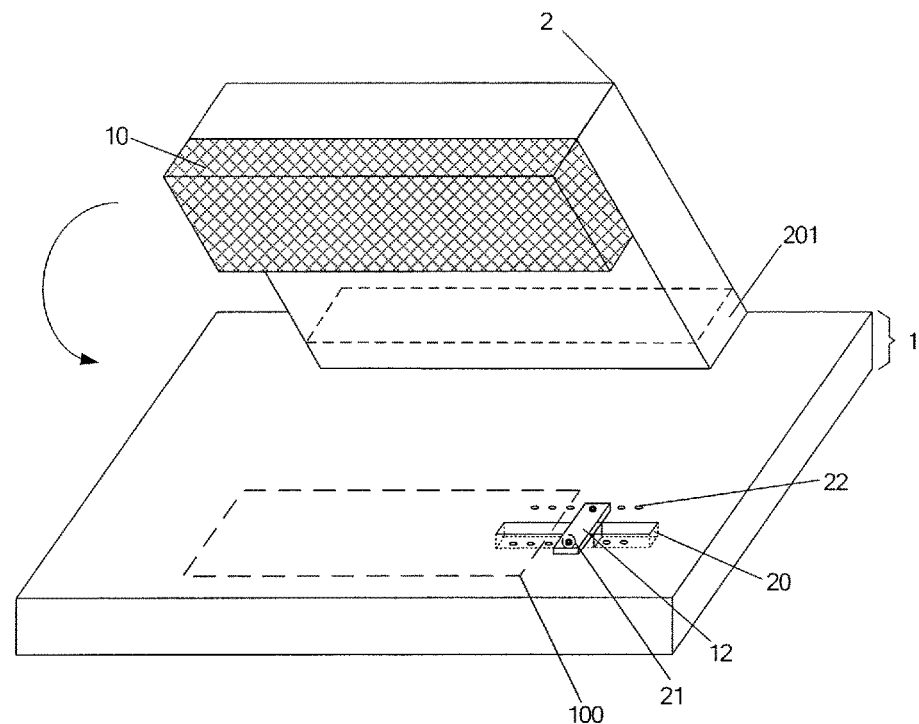
FIG. 6d is a schematically structural view illustrating the stopper unit in FIG. 6a applied to the maintenance fixture in FIG. 2.

FIGS. 6a and 6b illustrate an example of maintenance fixture comprising an adjustable stopper unit, wherein a substrate 23 is disposed within the PCB'A stopping area on the support baseplate 1 and is provided with a slide slot 20, the stopping block 12 is disposed in the slide slot 20 and is slidable along the slide slot 20; the stopping block 12 is provided with two through-holes (not illustrated), and the substrate 23 is further provided with two rows of screw holes 22 in an extending direction of the slide slot 20, so that the stopping block 12 can be secured onto the support baseplate 1 by passing the screws 21 through the corresponding through-holes of the stopping block 12 and fitting the screws 21 into the corresponding screw holes 22 of the substrate 23. Further, as illustrated in FIGS. 6a and 6c, the stopping block 12 can slide to a location illustrated in FIG. 6c along a direction indicated by CD in FIG. 6a and be secured there; of course, subsequently, the stopping block 12 can continue sliding along the CD direction. When the above-mentioned stopper unit is applied to the maintenance fixture as provided by the embodiment of the present invention, it is possible to adjust locations of the stopping blocks depending on a dimension of the PCB'A to be maintained so as to expand the application range of the maintenance fixture. As illustrated in FIG. 6d, if a dimension of the PCB'A is smaller than a dimension defined by the PCB'A stopping area, the stopping block 12 can slide into the PCB'A stopping area along the slide slot 20, thus allowing for limiting the PCB'A. Of course, FIG. 6d is merely illustrative, and the above-mentioned moveable stopping block as well as associated units thereof (for example: the slide slot etc.) can also he disposed at other zones depending on actual conditions, with details thereof omitted herein.

Figure 8:
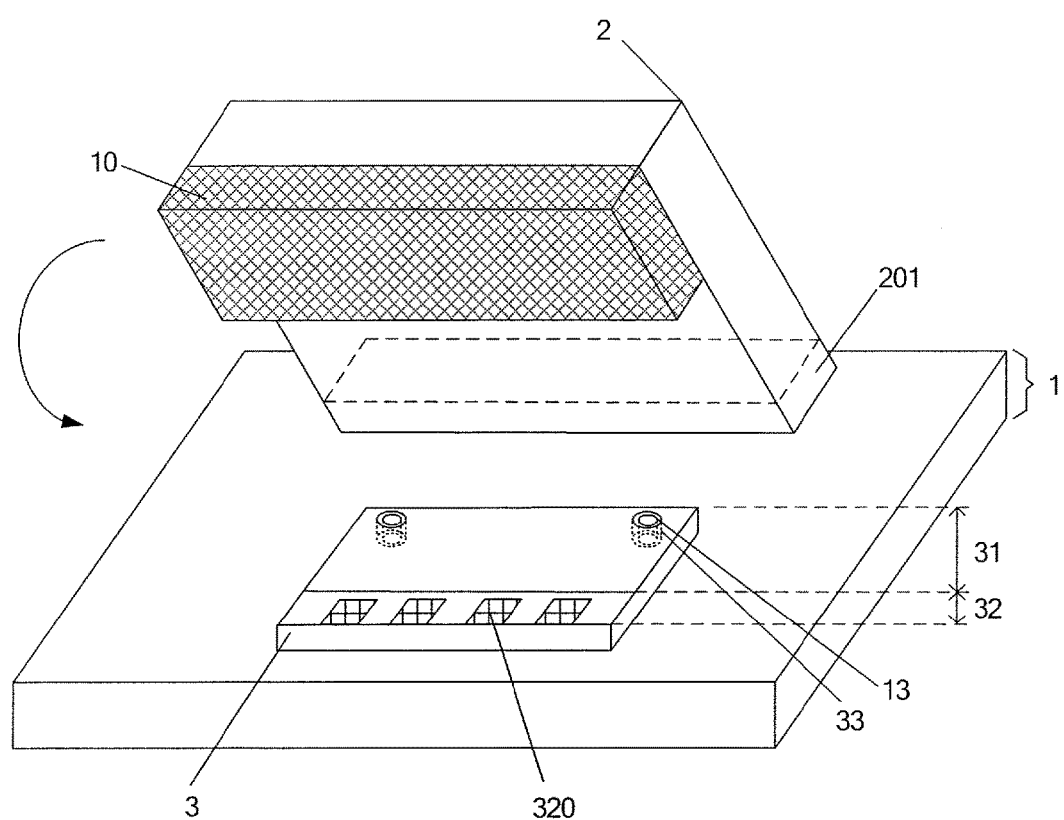
FIG. 8 is a schematically structural view V of the maintenance fixture for PCB'A as provided by the embodiment of present invention.

In an example as illustrated in FIG. 7, the above-mentioned stopper unit comprises a plurality of stopping posts 13 disposed at the PCB'A stopping area 100, each of the stopping posts 13 can be inserted into a corresponding stopping hole 33 in the PCB'A 3 so as to achieving an effect of limiting the PCB'A 3. A specific cross-sectional shape of the stopping post is not particularly defined in the embodiments of the present invention; for example, the cross section of the stopping post can have a shape of rectangle, circle, trapezoid etc., and in view of the fact that the stopping hole of the PCB'A usually is circular hole, hereinafter the embodiments of present invention and the drawings are all described with reference to the case where the stopping post has a circular cross section by way of example. Additionally, a specific height of the stopping post is not particularly defined in the embodiments of the present invention, but can be determined according to a thickness of the PCB'A. If the height of the stopping post is greater than the thickness of the PCB'A, as illustrated in FIG. 7, the stopping post will be protruding out of the stopping hole of the PCB'A; whereas, if the height of the stopping post is less than or equal to the thickness of the PCB'A, as illustrated in FIG. 8, the stopping post won't be protruding out of the stopping hole of the PCB'A.

Currently, the stopping holes of the PCB'A usually are disposed at the electronic component zone, so the stopping post having a height greater than the thickness of the PCB'A will be protruding out of the stopping hole of the PCB'A. In such case, upon rotating the cover plate, the stopping post will go against the cover plate, which results in that the barrier layer cannot be tightly contacted with the PCB'A and hence cannot function to prevent the wet stripper from infiltrating into the electronic component zone of the PCB'A. To solve this problem, as illustrated in FIG. 7 where the height of the stopping post 13 is protruding out of the stopping hole 33 located at the electronic component zone of the PCB'A 3, the barrier layer 10 can comprise plural first grooves 1 which are disposed in one-to-one correspondence with the stopping posts 13; in this way, upon rotating the cover plate 2, the stopping post 13 can be inserted into the corresponding first groove 14. A specific cross-sectional shape of the first groove is not particularly defined in the embodiments of the present invention; for example, the cross section of the first groove can have a shape of rectangle, circle, trapezoid etc., and in view of the fact that the stopping post usually is cylindrical post, hereinafter the embodiments of the present invention and the drawings are all described with reference to the case where the first groove has a circular cross section by way of example.

The foregoing describes three specific types of stopping structures, that is, the stopping groove, the stopping block and the stopping post, respectively. In practical implementations, the stopping groove, the stopping block or the stopping post can be provided independently. Of course, the above three types of stopping structures can also be combined in any possible ways, for example, it is possible to provide the stopping groove and the stopping post simultaneously, or to provide the stopping block and the stopping post simultaneously, or to provide the stopping groove and the stopping block simultaneously, or to provide the stopping groove, the stopping block and the stopping post simultaneously. The embodiments of the present invention are not intended to define the combination in any particular way, which can be determined according to actual conditions.

Figure 9:
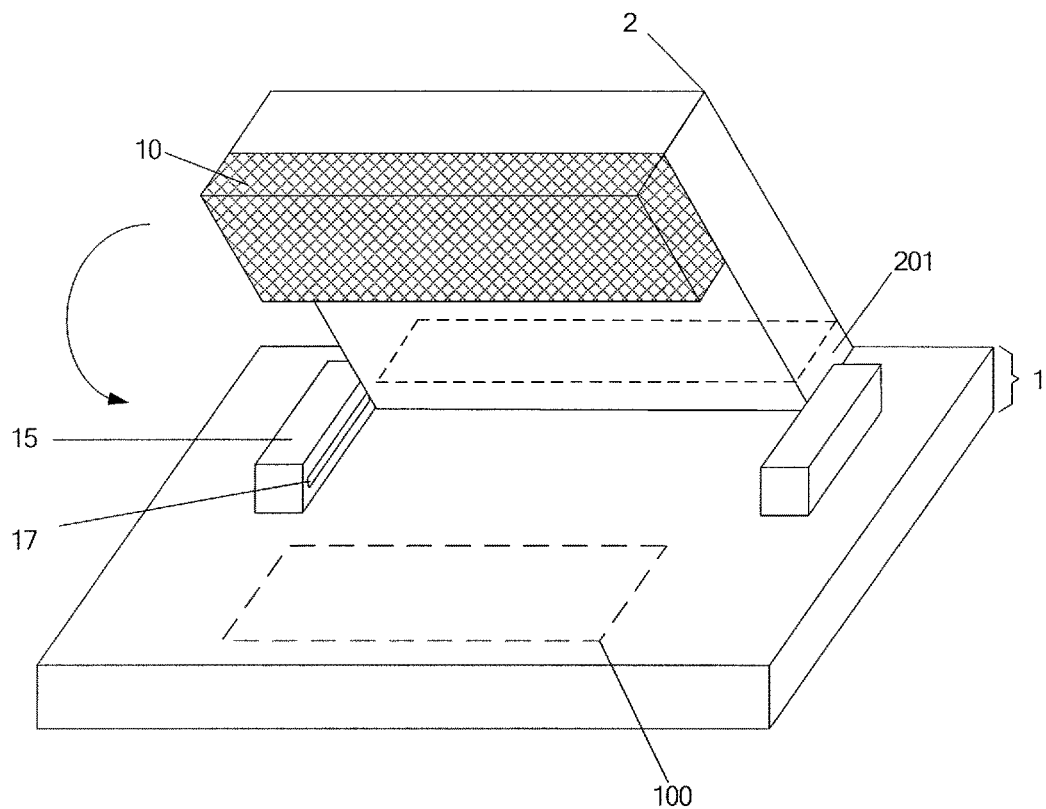
FIG. 9 is a schematically structural view VI of the maintenance fixture for PCB'A as provided by the embodiment of present invention.
Figure 10:
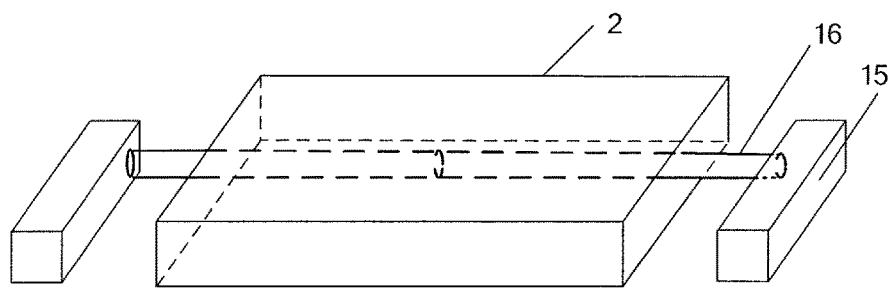
FIG. 10 is a schematic view illustrating an articulated connection between a connecter and a cover plate in the maintenance fixture for PCB'A in FIG. 8.
Figure 11:
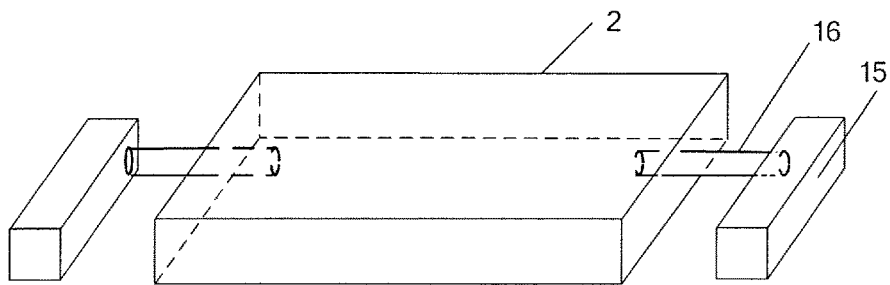
FIG. 11 is another schematic view illustrating the articulated connection between the connecter and the cover plate in the maintenance fixture for PCB'A in FIG. 8.

In an example, as illustrated in FIGS. 9-11, a surface of the support baseplate 1 can further comprise two connectors 15 disposed in opposite to each other; the first end 201 of the cover plate 2 connected with the support baseplate 1 is located between the two connectors 15; a second side and a third side of the cover plate 2 that are close to the two connectors are provided with a rotation shaft 16 respectively; and each of the connectors 15 is articulated with the cover plate 2 through the rotation shaft 16.

To be specified, the specific number of the rotation shaft is not particularly defined in the embodiments of the present invention. For example, as illustrated in FIG. 10, it is possible to provide only one rotation shaft 16 which penetrates the second and third sides of the cover plate 2 to be fitted with the two connectors 15, respectively; in this way, each of the connectors 15 can be articulated with the cover plate 2 by using this rotation shaft 16. As illustrated in FIG. 11, it is also possible to provide one rotation shaft 16 at both of the second and third sides of the cover 2, and the rotation shaft 16 can be engaged with the corresponding connector 15; in this way, each of the connectors 15 can be articulated with the cover plate 2 through the corresponding rotation shaft 16. As above, with the structure illustrated in FIG. 10, it is more convenient to rotate the cover plate; and with the structure illustrated in FIG. 11, it can reduce the manufacturing cost and manufacturing difficulty.

In case that the dimension of the PCB'A, of which the conductive adhesive is to be removed, is varied, the barrier layer may not completely cover the electronic component zone of the PCB'A upon rotating the cover plate, thus it is necessary to adjust a location of the barrier layer with respective to the PCB'A. To solve this problem, as illustrated in FIG. 9, each of the connectors 15 is provided with a slideway 17 at a side of the connector 15 close to the cover 2, and an end of the rotation shaft 16 connected with the connector 15 is slidable along the slideway 17. In this way, it is possible to conveniently adjust the location of the barrier layer with respective to the PCB'A simply by sliding the cover plate 2.

Figure 12:
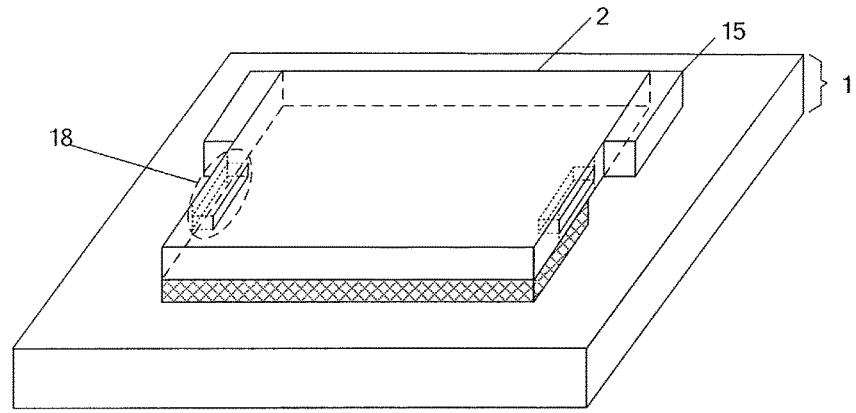
FIG. 12 is a schematically structural view VII of the maintenance fixture for PCB'A as provided by the embodiment of present invention.

Considering that it is required to open the cover plate to take out the PCB'A upon removing the conductive adhesive, in an example as illustrated in FIG. 12, for each of the above-mentioned sides of the cover plate 2 provided with the rotation shaft 16, a surface of the side that is opposite to the connector 15 can be provided with a second groove 18; in this way, upon rotating the cover plate 2 to allow the barrier layer contacting with the PCB'A, the second groove 18 will be deviated from the connector 15, which allows to open the cover plate easily. The specific number of the second groove is not particularly defined in the embodiments of the present invention; for example, the oppositely disposed two second grooves as illustrated in FIG. 12 can reduce the manufacturing difficulty.

In an example, a material of the barrier layer is silica gel, which can reduce a pressure applied by the cover plate to the electronic elements disposed in the electronic component zone.

Figure 13:
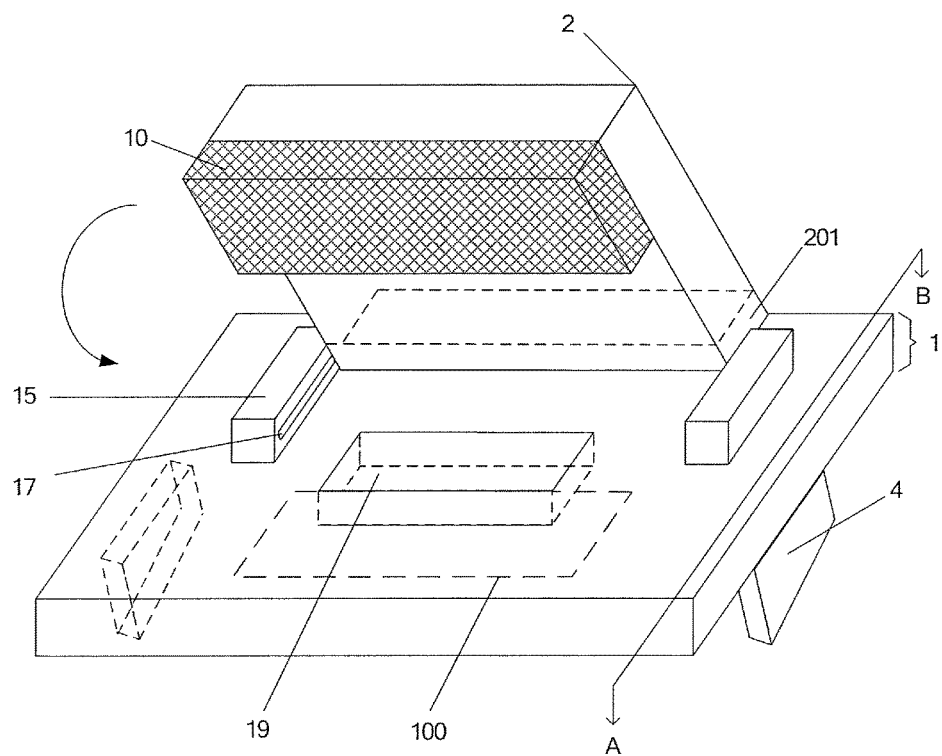
FIG. 13 is a schematically structural view VIII of the maintenance fixture for PCB'A as provided by the embodiment of present invention.

In an example as illustrated in FIG. 13, the support baseplate 1 further comprises a hollow portion 19 located adjacent to the PCB'A stopping area 100; in this way, upon the conductive adhesive being removed, most of the wet stripper remained at the support baseplate will flow into the hollow portion due to diffusion effect, thus reducing the work of cleaning the support baseplate.

Figure 14:
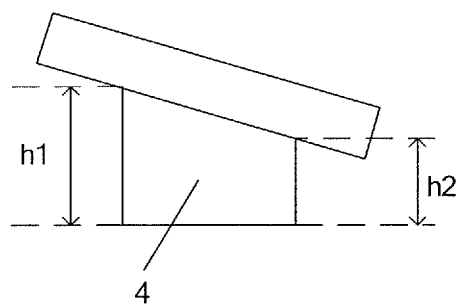
FIG. 14 is a sectional view taken along a direction of AB in FIG. 13.

In an example as illustrated in FIG. 13, the maintenance fixture further comprises a base 4, wherein a structure of the base 4 allows the support baseplate 1 to be inclined on the base 4, so that the wet stripper can flow from the PCB'A stopping area into the hollow portion. When the support baseplate is placed onto the base in an inclined manner, most of the wet stripper remained on the support baseplate can flow into the hollow portion under the gravity action with increased speed, thus saving the time cost for cleaning the support baseplate. The specific structure and number of the base are not particularly defined in the embodiments of the present invention; for example, as illustrated in FIGS. 13 and 14, it is possible to provide two oppositely disposed bases 4; and if the hollow portion 19 is located adjacent to a side of the PCB'A stopping area 100 close to a articulation point of the support baseplate 1 with the cover plate 2, a height of the base 4 gradually decreases from h1 to h2 from a position far away from the articulation point to a position close to the articulation point.

Figure 15:
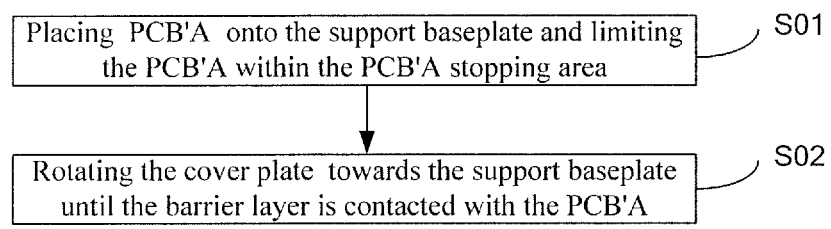
FIG. 15 is a flow chart illustrating a method of operating the maintenance fixture for PCB'A as provided by the embodiment of present invention.

The embodiments of the present invention further provide a method of operating the maintenance fixture in any one of the above examples. Hereinafter the method is described in more details with reference to the maintenance fixture illustrated in FIG. 2 by way of example. As illustrated in FIG. 15, the method comprises steps S01-S02 as below.

S01, placing a PCB'A 3 to be maintained onto the support baseplate 1 and limiting the PCB'A 3 within the PCB'A stopping area 100 defined by a surface of the support baseplate 1.

S02, rotating the cover plate 2 towards the support baseplate 1 until the barrier layer 10 is contacted with the PCB'A 3 so as to cover the electronic component zone 31 of the PCB'A and expose the electrode zone 32 of the PCB'A at the same time.

Subsequently, a removing fixture (for example, a Teflon fixture) can be employed to remove the conductive adhesive in the electrode zone of the PCB'A; of course, after removing the conductive adhesive completely, it is possible to use a dust-free fabric to wipe the electrode zone of the PCB'A. Then, the cover plate can be rotated again in a direction away from the support baseplate to facilitate taking out the PCB'A of which the conductive adhesive has been removed; at the same time, it is also possible to wipe off the wet stripper remained at the PCB'A stopping area and adhered on the barrier layer for the next removal operation. To continue removing the conductive adhesive of the next PCB'A, it is just required to repeat the above steps.

As stated above, the embodiments of the present invention further provide a method of operating the maintenance fixture. By operating the maintenance fixture provided by the embodiments of the present invention using such method, it prevents most of the wet stripper from infiltrating into the electronic component zone, thereby protecting the electronic elements in the electronic component zone of the PCB'A. In this way, it is possible to eliminate or at least mitigate the problem that, the electronic elements in the electronic component zone of the PCB'A may be subjected to corrosion and falling off due to the infiltration of the wet stripper into the electronic component zone which may make the PCB'A scrapped, when removing the conductive adhesive in the electrode zone of the PCB'A.

The foregoing are merely specific embodiments of the invention, but not limitative to the protection scope of the present disclosure. Therefore, the protection scope of the invention should be defined by the accompanying claims.

The present application claims the priority of the Chinese patent application No. 201610006736.9 filed on Jan. 4, 2016, the entirety of which is incorporated herein by reference as a part of the present application.

What is claimed is:

1. A maintenance fixture for printed circuit board assembly (PCB'A) comprising a support baseplate and a cover plate,
the support baseplate being configured to support a PCB'A to be maintained and being provided with a stopper unit, the stopper unit being configured to limit the PCB'A within a PCB'A stopping area defined by a surface of the support baseplate upon the support baseplate supporting the PCB'A;
the cover plate being movably connected to the support baseplate at a first end of the cover plate so as to be rotatable towards and away from the support baseplate with regard to the first end; the cover plate being provided with a barrier layer at a first side of the cover plate, the first side being perpendicular to a rotation direction of the cover plate and close to the support baseplate; the barrier layer being configured in such a manner that, upon the cover plate being rotated towards the support baseplate, the barrier layer being contacted with the PCB'A supported on the support baseplate to cover an electronic component zone of the PCB'A and also expose an electrode zone of the PCB'A at the same time;
wherein the stopper unit comprises a plurality of stopping posts disposed in the PCB'A stopping area, and the stopping posts can be inserted into stopping holes provided in the PCB'A respectively, upon the support baseplate supporting the PCB'A.

2. The maintenance fixture according to claim 1, wherein the barrier layer comprises first grooves disposed in one-to-one correspondence with the stopping posts; and
each of the stopping posts is inserted into a corresponding first groove upon the cover plate being rotated towards the support baseplate.

3. A maintenance fixture for printed circuit board assembly (PCB'A) comprising a support baseplate and a cover plate,
the support baseplate being configured to support a PCB'A to be maintained and being provided with a stopper unit, the stopper unit being configured to limit the PCB'A within a PCB'A stopping area defined by a surface of the support baseplate upon the support baseplate supporting the PCB'A;
the cover plate being movably connected to the support baseplate at a first end of the cover plate so as to be rotatable towards and away from the support baseplate with regard to the first end; the cover plate being provided with a barrier layer at a first side of the cover plate, the first side being perpendicular to a rotation direction of the cover plate and close to the support baseplate; the barrier layer being configured in such a manner that, upon the cover plate being rotated towards the support baseplate, the barrier layer being contacted with the PCB'A supported on the support baseplate to cover an electronic component zone of the PCB'A and also expose an electrode zone of the PCB'A at the same time;
wherein the stopper unit comprises a plurality of stopping blocks disposed at a periphery of the PCB'A stopping area.

4. The maintenance fixture according to claim 3, wherein locations of the plurality of stopping blocks at the support baseplate are adjustable.

5. The maintenance fixture according to claim 3, wherein a surface of the support baseplate comprises two connectors disposed in opposite to each other, the first end of the cover plate is located between the two connectors; and
a second side and a third side of the cover plate that are close to the two connectors respectively are provided with a rotation shaft, and each of the connectors is articulated with the cover plate through the rotation shaft.

6. The maintenance fixture according to claim 5, wherein a single rotation shaft is disposed to be passing through both of the second side and the third side so as to be fitted with both of the two connectors, respectively.

7. The maintenance fixture according to claim 5, wherein two rotation shafts are disposed at the second side and the third side, respectively, so as to be fitted with the two connectors, respectively.

8. The maintenance fixture according to claim 5, wherein a side of each of the two connectors that is close to the cover plate is provided with a slideway, and an end of the rotation shaft connected with the connector is slidable along the slideway.

9. The maintenance fixture according to claim 5, wherein a side of each of the second side and the third side of the cover plate that is far away from the corresponding connector is provided with a second groove which is deviated from the corresponding connector upon the cover plate being rotated towards the support baseplate.

10. The maintenance fixture according to claim 3, wherein a material of the barrier layer is silica gel.

11. The maintenance fixture according to claim 3, wherein the support baseplate further comprises a recess extending into the surface of the support baseplate, and the recess is located adjacent to the PCB'A stopping area.

12. The maintenance fixture according to claim 11, further comprising a base configured to support the support baseplate in an inclined manner.

13. The maintenance fixture according to claim 4, wherein the stopper unit comprises a substrate, a slide slot disposed on the substrate, and a stopping block slidably disposed in the slide slot.

14. The maintenance fixture according to claim 3 wherein the first end of the cover plate is articulated with the support baseplate.

15. The maintenance fixture according to claim 3, wherein the barrier layer is disposed at a location on the first side of the cover plate away from the first end.

16. A maintenance fixture for printed circuit board assembly (PCB'A) comprising a support baseplate and a cover plate, the support baseplate being configured to support a PCB'A to be maintained and being provided with a stopper unit, the stopper unit being configured to limit the PCB'A within a PCB'A stopping area defined by a surface of the support baseplate upon the support baseplate supporting the PCB'A;

the cover plate being movably connected to the support baseplate at a first end of the cover plate so as to be rotatable towards and away from the support baseplate with regard to the first end; the cover plate being provided with a barrier layer at a first side of the cover plate, the first side being perpendicular to a rotation direction of the cover plate and close to the support baseplate; the barrier layer being configured in such a manner that, upon the cover plate being rotated towards the support baseplate, the barrier layer being contacted with the PCB'A supported on the support baseplate to cover an electronic component zone of the PCB'A and also expose an electrode zone of the PCB'A at the same time;

wherein the stopper unit comprises a stopping groove disposed in the PCB'A stopping area.

* * * * *